United States Patent [19]

Tsukihashi et al.

[11] Patent Number: 5,206,985
[45] Date of Patent: May 4, 1993

[54] AUTOMATIC PIN INSERTING APPARATUS

[75] Inventors: Kazunobu Tsukihashi, Yokohama; Yasuaki Shinomiya, Tokyo, both of Japan

[73] Assignee: Sumitomo Metal Mining Co., Ltd., Tokyo, Japan

[21] Appl. No.: 772,088

[22] Filed: Oct. 8, 1991

[30] Foreign Application Priority Data

Oct. 8, 1990 [JP] Japan .................. 2-268442

[51] Int. Cl.$^5$ .............................. H05K 3/30
[52] U.S. Cl. .................. 29/720; 29/739
[58] Field of Search ........... 29/739, 705, 720, 721, 29/743

[56] References Cited

U.S. PATENT DOCUMENTS 4,598,456 7/1986 McConnell ............ 29/721 X
4,973,216 11/1990 Domm .................. 29/721 X

*Primary Examiner*—Carl E. Hall
*Attorney, Agent, or Firm*—Armstrong, Westerman, Hattori, McLeland & Naughton

[57] ABSTRACT

An automatic pin inserting apparatus for inserting a pin into a frame-shaped workpiece, in particular, a frame-shaped workpiece having a welded structure. The apparatus includes a table freely movable in X and Y directions, and moving means for moving the table in these directions, which correspond to right-and-left directions as well as up-and-down directions. An optical detecting means is provided for detecting a hole location in each workpiece placed on the table, as is a swing arm for moving a pin held in a waiting position to a position on an optical axis of the optical detecting means, with the swing arm being operated by a swing means. A pin inserting means is included, which can be moved from the waiting position into the pin inserting side of the swing arm on the optical axis, with the pin inserting means being rotationally moved by the swing means through a transmitting means. A pin supply means is included for supplying a pin into the swing arm located in the waiting position, as is a control means for controlling the swing means in response to a signal generated by the optical detecting means, so as to align the optical axis with a center point of the hole of the workpiece.

14 Claims, 6 Drawing Sheets

AUTOMATIC PIN INSERTING APPARATUS

BACKGROUND OF THE INVENTION

1. Field of the Invention

The present invention relates to an automatic pin inserting apparatus for inserting a pin into a frame shaped workpiece. More specifically, the invention can be utilized for frame-shaped workpieces having a welded structure.

2. Description of Related Art

FIGS. 7, 8 and 9 illustrate a frame-shaped workpiece W of a welded structure, having tapered pin P inserted in pin-hole H which is located therein. When inserting pin P, it is difficult to detect the exact location of pin-hole H correctly, because an insertion allowance between the leading end outside diameter d of the tapered pin P and the inside diameter D of the pin-hole H is relatively small. In addition, the location of the pin-hole H can vary randomly, due to typical tolerances associated with a welded construction.

Therefore, the conventional method of alignment and the insertion of the tapered pin P with the pin-hole H is to use a manual operation.

For example, assume the inside diameter D of the pin-hole H is 3.1 mm, the leading end outside diameter d of the tapered pin P is 2.9 mm, and the variation of the pin-hole location is ±1.0 mm max. In this case, an insertion allowance is calculated as $3.1 - 2.9 = 0.2$. The fact that a value of insertion allowance is 0.2 means that a value of tolerance in directions of X and Y, respectively, is ±0.1 mm This tolerance (±0.1 mm) is considered extraordinarily small.

An apparatus being capable of detecting a location of a pin-hole with such a small tolerance and inserting a pin automatically into the pin-hole does not presently exist.

SUMMARY OF THE INVENTION

It is therefore an object of the present invention to provide an automatic pin inserting apparatus being capable of inserting a pin into a pin-hole when the pin inserting allowance or tolerance is extraordinarily small.

A technology exists of discriminating and measuring an object outline and dimension thereof by processing an image signal generated by a CCD (Charge Coupled Device) camera, in a binary value. This technology is expanding its range of application, such as an artificial eye for use in industrial robots. However, CCD camera technology is new and the peripheral units associated therewith are complicated and expensive.

An image signal of a CCD TV camera is characterized in that it can easily process a discrimination of a changing shape and a measurement of its location, because two-dimensional (X, Y) output signals are obtained simultaneously. However, it is possible to obtain the central location of a hole by processing a one-dimensional output signal of an inexpensive CCD line image sensor by means of a micro-processor. This method is accurate when the hole is round and it has a uniform shape, such as the pin holes for inserting tapered pins.

As a result of considerable research, the inventors have obtained a binary signal corresponding to 220 bits, for example, when a camera was used which was provided with CCD element of 4096 bits and a macrolens was selected. An image of a hole, with an inside diameter of 3.1 mm, was focused on a plane of picture element. Therefore, a resolving power per bit with an accuracy of $3.1/220 = 0.014$ mm can be obtained. Since the tolerance of a pin to be inserted is approximately 0.1 mm, the resolving power of 0.014 mm is a satisfactory value.

According to the present invention, there is provided an automatic pin inserting apparatus comprising:

- a table freely movable in X and Y directions;
- moving means for moving the table in the X and Y directions, which directions correspond to right-and-left directions as well as up-and-down directions;
- an optical detecting means for detecting a hole location in each workpiece placed on the table;
- a swing arm for moving a pin held in a waiting position to a position on an optical axis of the optical detecting means, with the swing arm being operated by a swing means;
- a pin inserting means disposed to be moved from the waiting position into the pin inserting side of the swing arm on the optical axis, with the pin inserting means being rotationally moved by the swing means through a transmitting means;
- a pin supply means for supplying a pin into the swing arm located in the waiting position; and
- a control means for controlling the swing means in response to a signal generated by the optical detecting means, so as to align the optical axis with a center point of the hole of the workpiece.

Preferably, the optical detecting means comprises a fiberscope, a condenser lens, an image sensor having a CCD element, for example, of 4096 bits, and macrolens. That is, the optical detecting means is, preferably, a two-dimensional detecting means, in which a microcomputer processes a one-dimensional optically detected signal.

Furthermore, the swing arm is preferably provided with a holding portion for holding a pin by a vacuum or suction.

Furthermore, preferably, the transmitting means comprises a pinion fixed to a swing shaft of the swing arm, and a sector gear engaging with the pinion and having a gear ratio, for example, of 1:5.

Furthermore, preferably, the pin inserting means comprises a holding arm fixed to a sector gear shaft, and a miniature cylinder fixed to the leading end of the arm.

Furthermore, preferably, the pin supply means comprises a well known bowl-type parts feeder and a straight-type parts feeder.

In the automatic pin inserting apparatus discussed above, a pin is held by the swing arm being positioned in the waiting position, and the pin inserting miniature cylinder is kept in a retracted position.

At first, a radiation light beam is radiated into the pin-hole portion of a workpiece from a fiberscope, and the table is moved in the X and Y directions so as to align the optical axis with the center of the pin-hole, in response to the signal generated by the image sensor.

Then, after the swing arm and the miniature cylinder are rotated (shifted) into an operating position, i.e., the optical axis, the pin is inserted into the pin-hole of the workpiece by actuating the cylinder.

BRIEF DESCRIPTION OF THE DRAWINGS

An embodiment of the present invention is explained hereinafter with reference to the accompanying drawings.

DESCRIPTION OF THE PREFERRED EMBODIMENT

Figure 1:
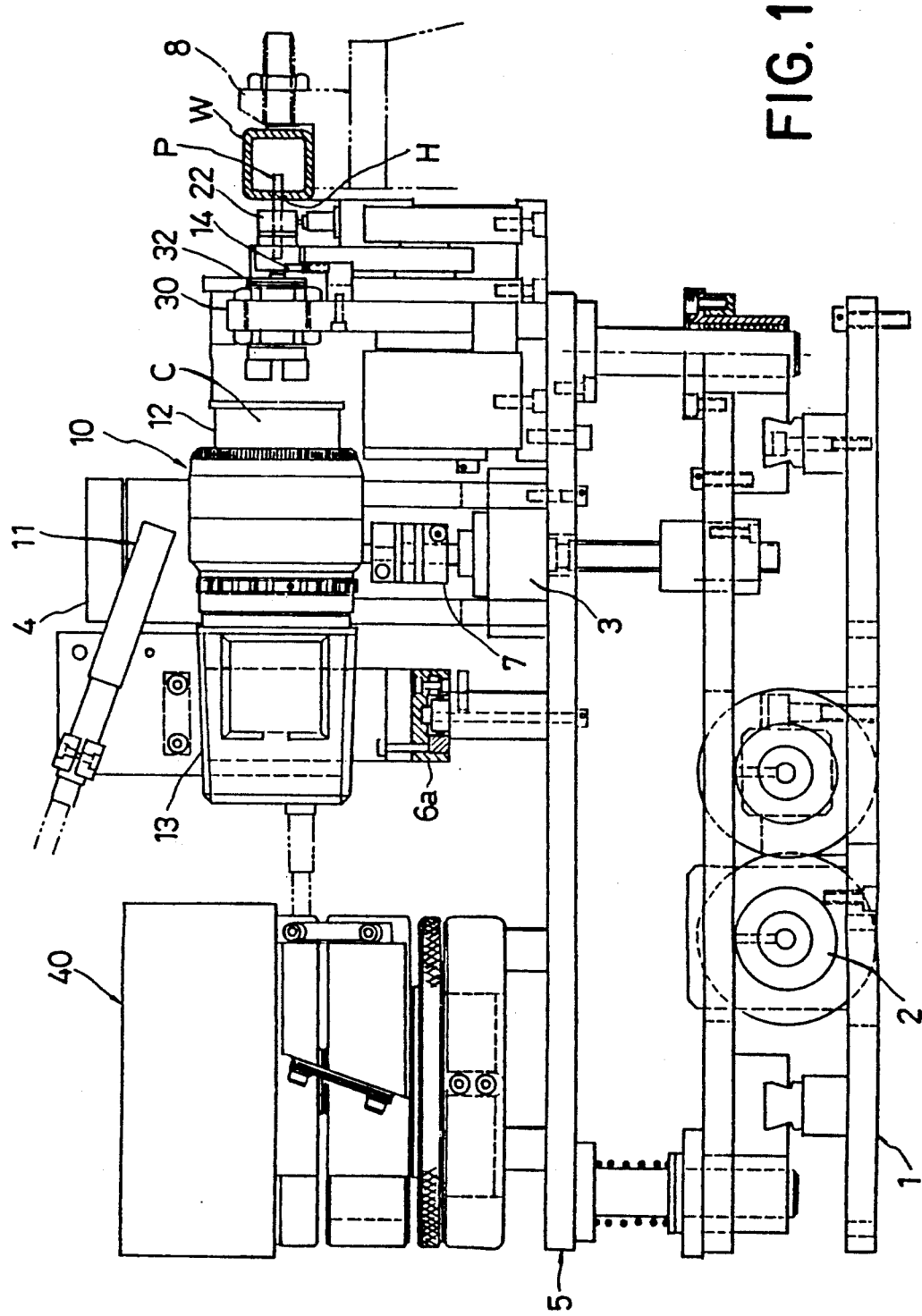
FIGS. 1 and 2 are a side view and a top plan view, respectively, of an embodiment of the present invention.

In FIG. 1, a table 5 is supported on the base 1 so as to be movable in the X-direction, i.e., right-and-left, and in the direction Y, i.e., up-and-down, by means of an X-axis drive unit 2, a Y-axis ball screw 3, and a Y-axis stepping motor 4, all of which are moving means. A coupling 7 serves to transmit the output of the Y-axis stepping motor 4 to the Y-axis ball screw 3.

Figure 2:
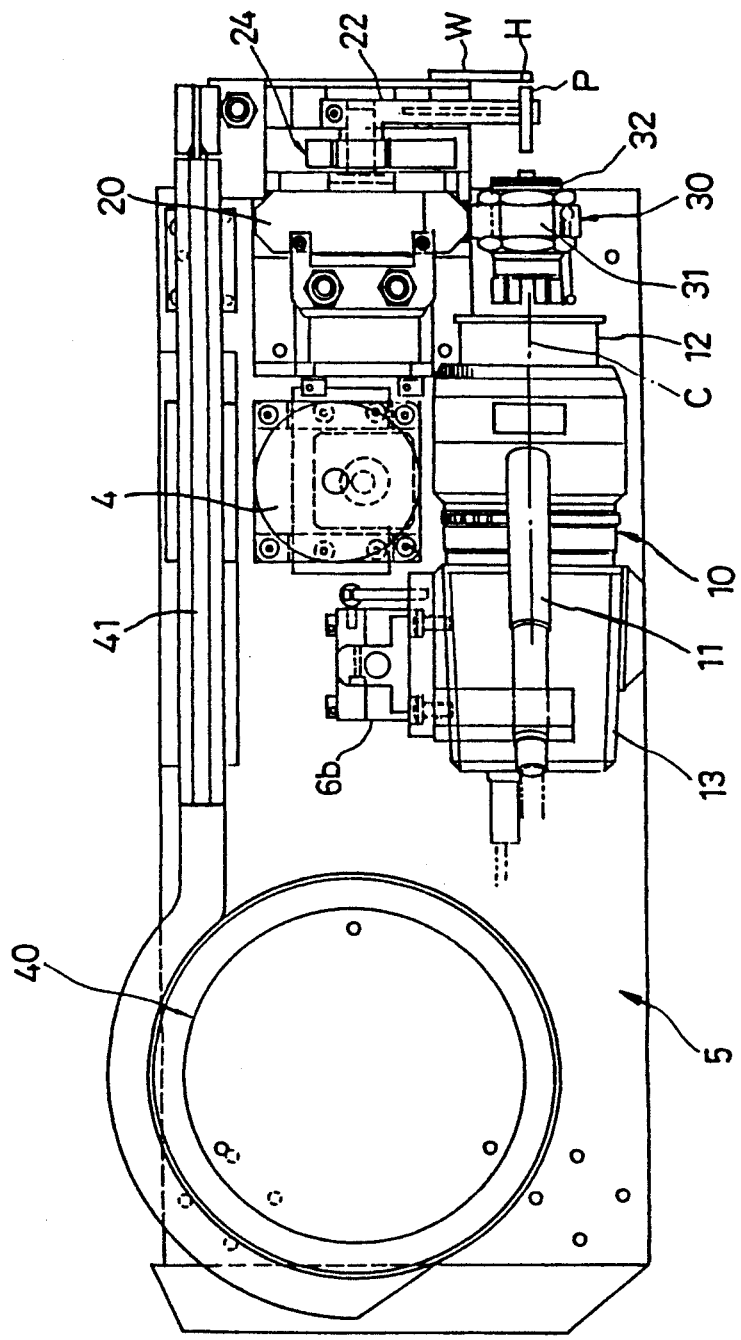

Also, with reference to FIG. 2, the table 5 is provided with an optical detecting means 10, a pin picker 22 which is a swing arm moved by a pneumatic rotary actuator 20 acting as a swing means, a pin inserting means 30 moved by a transmitting means 24, a bowl-type parts feeder 40 and a straight-type parts feeder 41 both of which are pin feeding means, and a micro-computer (not-shown) which is a control means.

The optical detecting means 10 comprises a fiberscope 11 projecting a radiation light beam, a macrolens 12 (for example, 50 mm, F2.8), and an image sensor 13 having a CCD element, for example, of 4096 bits, as is presently available on the market.

Figure 3:
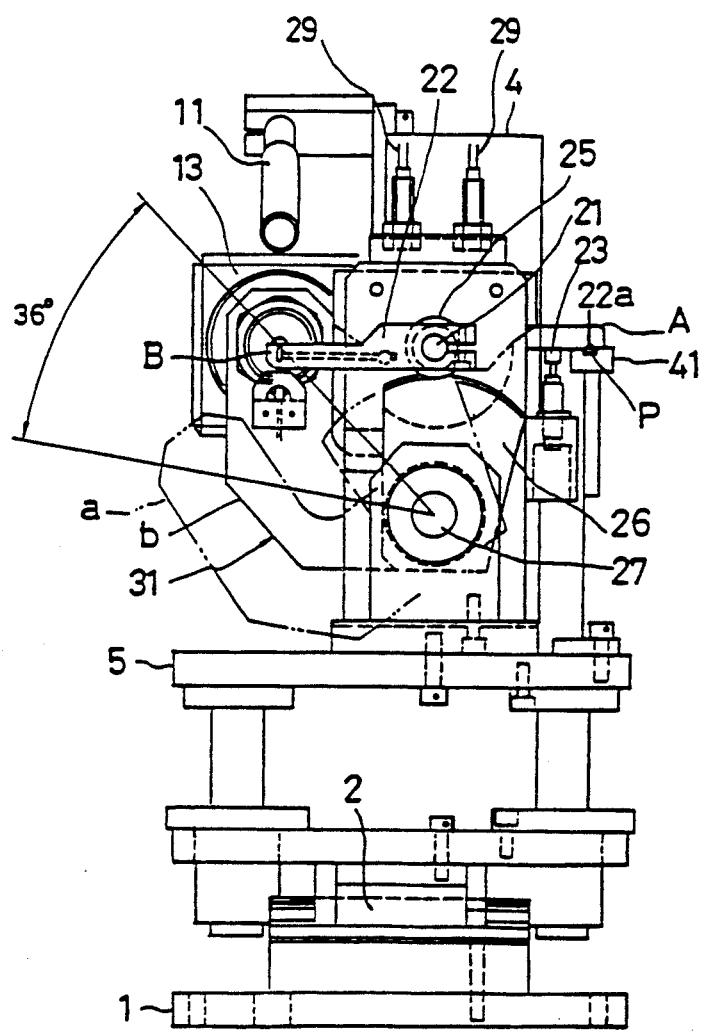
FIGS. 3 and 4 are a front view and a partially sectional side view, respectively, of a main portion of the embodiment.
Figure 4:
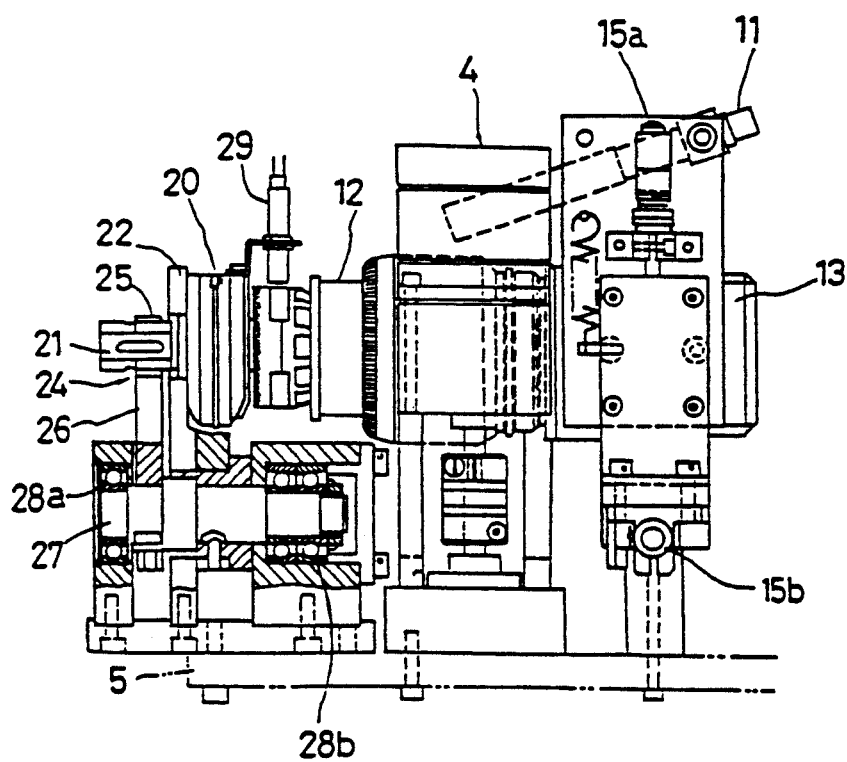

Also, with reference to FIGS. 3 and 4, the pin picker 22 is fixed to the swing shaft 21, which is an output shaft of the rotary actuator 20, so as to be rotated by 180° from a waiting position A, shown by a broken line, to an operating position B, shown by a solid line. Furthermore, pin picker 22 is provided with a holding portion 22a, which holds an oriented pin P by a vacuum or suction. Pin P is received at holding portion 22a after being fed through parts feeders 40 and 41. Reference numeral 23 in the drawings is a shock absorber for absorbing a shock caused by the return of picker 22 to the waiting position A.

The transmitting means 24 comprises a pinion 25 fixed to the swing shaft 21 and a sector gear 26 with a gear ratio, for example, of 1:5, being engaged with the pinion 25. The sector gear 26 is supported rotatably on the table 5, by means of a supporting shaft 27, which is supported by bearings 28a, 28b.

The pin inserting means 30 comprises a holding arm 31 fixed to the supporting shaft 27, and a pin inserting miniature cylinder 32 mounted on the leading end of the arm 31. Thereby, as shown in FIG. 3, the pin inserting means 30 (or the arm 31) is rotated by 36° from a retracted position a, shown by a broken line, to an operating position b, shown by a solid line, by means of the transmitting means 24 with the above-mentioned gear ratio 1:5. In FIG. 1, the reference numerals 6a and 6b are cross-roller tables for performing a fine adjustment in the X and Y directions in order to offset the optical axis of camera, a reference numeral 7 is a coupling, and a reference numeral 14 is an optical sensor fiber. Also, in FIG. 4, reference numerals 15a and 15b are microspindles, and reference numeral 29 is a proximity switch. The proximity switch 29 confirms the position of the rotary actuator 20 after rotated by 180°. Furthermore, Y-axis microspindle 15a and X-axis microspindle 15b carry out fine adjustment after the initial adjustment.

As a result of this construction, the optical axis C of the optical detecting means 10, the axis of the pin P of the pin picker 22 at the operating position B, and the axis of the miniature cylinder 32 at the operation position b are entirely aligned.

Before inserting a pin, the pin picker 22 is kept in the retracted position A, the holding portion 22a holds a pin P, and the holding arm 31 is kept in the retracted position a.

Workpiece W is set at the fixture 8, and a radiation light beam is projected from the fiberscope 11 toward a portion of the pin-hole H.

Figure 5:
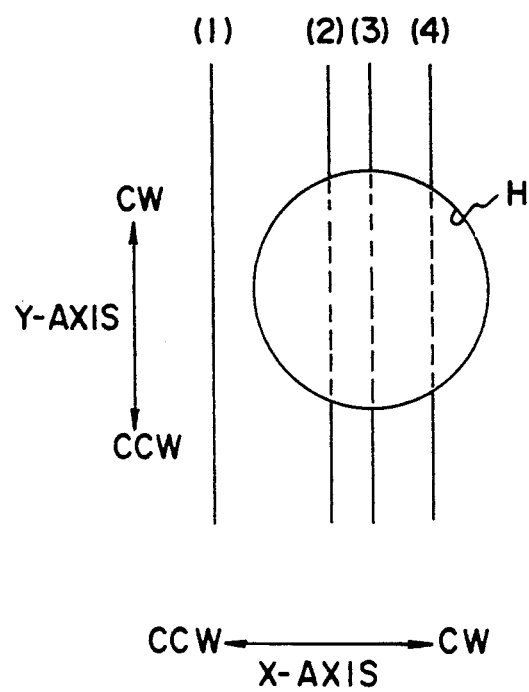
FIGS. 5 and 6 are explanatory views illustrating alignment control in the direction of X-axis and Y-axis, respectively.

The microcomputer controls the apparatus as follows, in response to signals generated by an image sensor 13. As shown in FIG. 5, the radiation light beam scans the pin-hole H through actuation of the X-axis drive unit 2 in the direction of CW of the X-axis. This scanning is started from an original position (1). The maximum digital switch values are compared. The comparison is started from the position (2) (where the digital switch value is 50 bits). Then, at the position (3) (the center of the pin-hole H), a maximum digital switch value is detected. Thereafter, when the radiation light beam arrived at the position (4) (where the digital switch value is 0 bits), the radiation light beam scans the pin-hole in the direction of CCW in the X-axis, through actuation of unit 2 in the reverse direction. Now, the signal transmitted from the image sensor is transmitted into the microcomputer, and then, is processed by a bit calculation. It is required to modify the control software each time when the diameter of pin-hole changes for any reason (such as design revision, drill wear, or other deterioration in the sharpness of the cutter). Therefore, a digital switch is provided which is capable of having modification data input easily. Then, when the input data and the maximum value detected at the position (3) have the same value, the X-axis drive unit 2 will be stopped.

Figure 6:
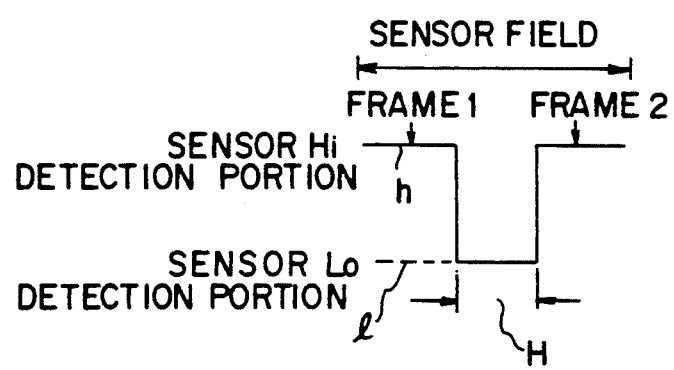
Figure 9:
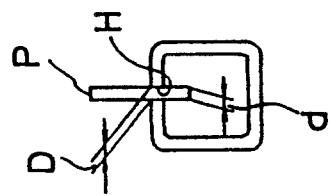
FIG. 9 a sectional view taken along line 9—9 of FIG. 7.
Figure 8:
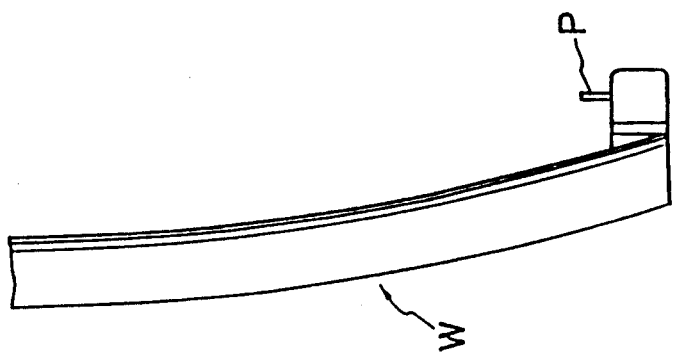
FIGS. 7 and 8 are a front view and a side view, respectively, of an example of the workpiece.
Figure 7:
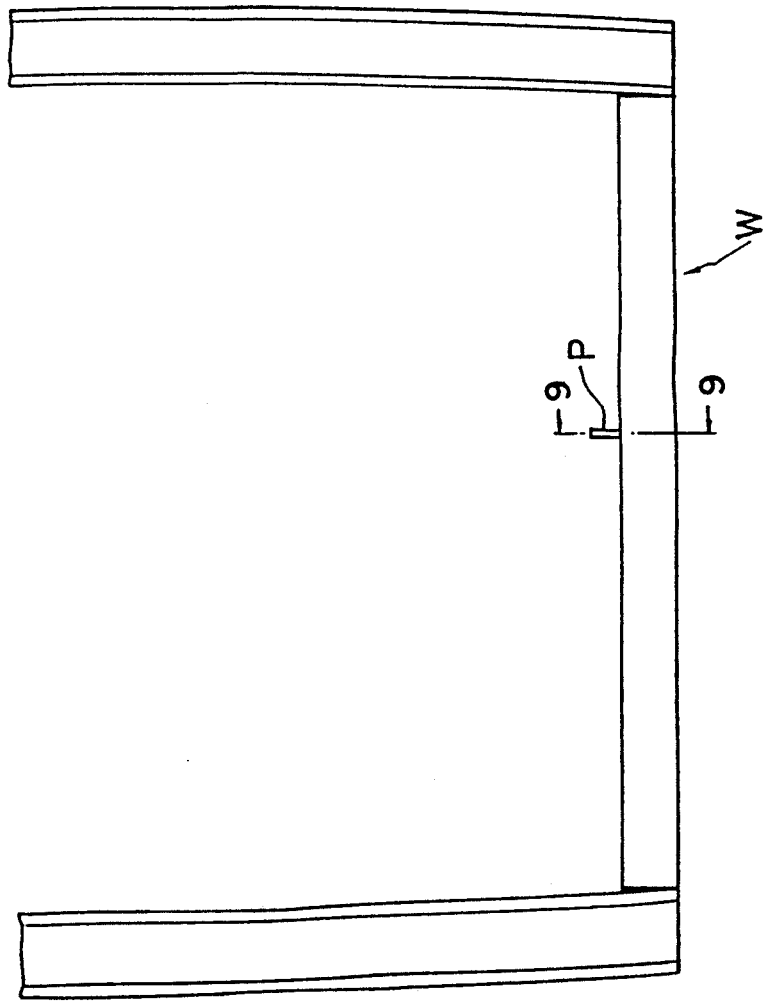

FIG. 6 illustrates an output waveform of image sensor 13, for the direction of Y-axis. Hi detection portion h corresponds to the frame 1 and 2 and the Lo detection portion l corresponds to the pin-hole H. The stepping motor 4 is controlled in such a way that the Hi detection portion h will have an equal value at frame 1 and 2 (frame 1=frame 2). Thereby, the optical axis C is aligned to the center of the pin-hole H with the accuracy of 0.014 mm, as described in the Summary of the Invention.

Then, after the pin picker 22 and the miniature cylinder 32 were moved (shifted) onto the optical axis C by actuating the rotary actuator 20, the pin P is inserted into the pin-hole H of the workpiece W by actuating the miniature cylinder 32. Since the tolerance for the inserted pin P is approximately ±0.1 mm as aforementioned, the accuracy of 0.014 mm is a satisfactory value for smoothly inserting the pin P into the pin-hole H.

According to the present invention, the pin inserting work can be carried out automatically, by aligning the optical axis with the center of the pin-hole, as well as by aligning the pin axis and the pin inserting axis with the optical axis, whereby the pin can be inserted into the pin-hole of the workpiece with an extraordinarily small inserting tolerance.

Therefore, a variety of advantageous results can be attained, such as:

(1) By fully automating the pin insertion operation, it is possible to eliminate monotonous and tedious manual labor;

(2) Due to this full-automation, a cost reduction can be attained;

(3) An automated checking for missing or deficient pin-holes in the workpiece can be effected;

(4) A profitable layout of the apparatus can be attained so that a stagnation of the products in the transfer line can be eliminated;

(5) The floor space of the manufacturing plant can spared; and (6) a profitable process control of production (product), i.e., an automatic counting and recording of the quantity of the products and defects, respectively, and the quantity control by the output signal can be effected.

We claim:

1. An automatic pin inserting apparatus, comprising:
a table freely movable in X and Y directions;
moving means for moving said table in the X and Y directions, which directions correspond to right-and-left directions as well as up-and-down directions;
an optical detecting means for detecting a hole location in a workpiece placed on said table;
a swing arm for moving a pin from a waiting position to an operating position on an optical axis of said optical detecting means;
a swing means for operating said swing arm;
a pin inserting means disposed to be moved from said waiting position to a pin inserting side of said swing arm on said optical axis;
a transmitting means driven by said swing means, said pin inserting means being rotationally moved by said transmitting means;
a pin supply means for supplying a pin to said swing arm when said swing arm is in said waiting position; and
a control means for controlling said moving means in response to a signal generated by said optical detecting means, so as to align said optical axis with a center point of the hole location of said workpiece.

2. An automatic pin inserting apparatus as claimed in claim 1, wherein said optical detecting means comprises an image sensor including a CCD.

3. An automatic pin inserting apparatus as claimed in claim 1, wherein said optical detecting means comprises a fiberscope, and a macrolens.

4. An automatic pin inserting apparatus as claimed in claim 1, wherein said swing arm includes a suction or vacuum holding portion for holding said pin by suction force.

5. An automatic pin inserting apparatus as claimed in claim 1, wherein said pin inserting means includes a holding arm having a free end, and a pin inserting miniature cylinder mounted at said free end of said holding arm.

6. An automatic pin inserting apparatus as claimed in claim 1, further comprising a shock absorber for absorbing a shock caused by return of said swing arm to said waiting position.

7. An automatic pin inserting apparatus as claimed in claim 1, wherein said transmitting means includes a pinion in engagement with a sector gear.

8. An automatic pin inserting apparatus, comprising:
a table freely movable in X and Y directions;
moving means for moving said table in the X and Y directions, which directions correspond to right-and-left directions as well as up-and-down directions;
an optical detecting means for detecting a hole location in a workpiece placed on said table;
a swing arm for moving a pin from a waiting position to an operating position on an optical axis of said optical detecting means;
a swing means for operating said swing arm;
a pin inserting means disposed to be moved from said waiting position to a pin inserting side of said swing arm on said optical axis;
a transmitting means driven by said swing means, said pin inserting means being rotationally moved by said transmitting means;
a pin supply means for supplying a pin to said swing arm when said swing arm is in said waiting position; and
a control means for controlling said moving means in response to a signal generated by said optical detecting means, so as to align said optical axis with a center point of the hole location of said workpiece, and for controlling said swing means to move said swing arm from the waiting position to the operating position on the optical axis of said optical detecting means.

9. An automatic pin inserting apparatus as claimed in claim 8, wherein said optical detecting means comprises an image sensor including a CCD.

10. An automatic pin inserting apparatus as claimed in claim 8, wherein said optical detecting means comprises a fiberscope, and a macrolens.

11. An automatic pin inserting apparatus as claimed in claim 8, wherein said swing arm includes a suction or vacuum holding portion for holding said pin by suction force.

12. An automatic pin inserting apparatus as claimed in claim 8, wherein said pin inserting means includes a holding arm having a free end, and a pin inserting miniature cylinder mounted at said free end of said holding arm.

13. An automatic pin inserting apparatus as claimed in claim 8, further comprising a shock absorber for absorbing a shock caused by return of said swing arm to said waiting position.

14. An automatic pin inserting apparatus as claimed in claim 8, wherein said transmitting means includes a pinion in engagement with a sector gear.

* * * * *